United States Patent [19]

Gurley et al.

[11] Patent Number: 4,945,414
[45] Date of Patent: Jul. 31, 1990

[54] COMPENSATOR FOR TEMPERATURE-INDUCED BLACK LEVEL DRIFT FOR USE IN A TELEVISION RECEIVER

[75] Inventors: Thomas D. Gurley; Gene K. Sendelweck, both of Indianapolis, Ind.

[73] Assignee: RCA Licensing Corporation, Princeton, N.J.

[21] Appl. No.: 193,430

[22] Filed: May 12, 1988

[51] Int. Cl.$^5$ .................. H04N 5/52; H04N 5/57
[52] U.S. Cl. .................. 358/168; 358/166; 358/174; 307/310; 307/491; 330/289
[58] Field of Search .......... 358/37, 166, 168, 160, 358/174, 172, 184; 307/310, 491, 591; 330/256, 266, 272, 289

[56] References Cited

U.S. PATENT DOCUMENTS

| | | | |
|---|---|---|---|
| 3,651,379 | 3/1972 | Moisand | 317/41 |
| 4,197,557 | 4/1980 | Tuma et al. | 358/34 |
| 4,401,898 | 8/1983 | Sommerer | 307/310 |
| 4,494,145 | 1/1985 | Kokufukata et al. | 358/163 |
| 4,589,022 | 5/1986 | Prince | 358/166 |
| 4,716,315 | 12/1987 | Bell | 307/491 |
| 4,749,889 | 6/1988 | Lagoni | 307/491 |

Primary Examiner—Tommy P. Chin
Attorney, Agent, or Firm—Joseph S. Tripoli; Peter M. Emanuel; Thomas F. Lenihan

[57] ABSTRACT

A temperature compensation network for an integrated circuit amplifier in a television receiver includes a thermistor mounted physically adjacent to, and electrically connected in parallel with the brightness control potentiometer, to the brightness control terminal of the integrated circuit. By mounting the thermistor in close proximity to the integrated circuit to be controlled, the thermistor is able to compensate for both self-heating of the integrated circuit and ambient temperature variations.

9 Claims, 5 Drawing Sheets

COMPENSATOR FOR TEMPERATURE-INDUCED BLACK LEVEL DRIFT FOR USE IN A TELEVISION RECEIVER

FIELD OF INVENTION

This invention relates to the field of temperature compensation for brightness control ciruitry in a television receiver.

BACKGROUND OF INVENTION

The term "kine" as used herein means the same as television picture tube.

Black level drift has long been a problem in television recievers. It is characterized by an undesirable variation in the visual black level or brightness of the displayed picture during warm-up of the television receiver. The primary causes of black level drift are parameter variations caused by temperature changes in the receiver circuitry and in the kine itself.

Electronic circuits employing semiconductors are subject to operating parameter changes in response to temperature variations in and around the electronic components of the circuits. The temperature variations are caused by self-heating of the components and by a rise in ambient temperature within the cabinet caused by warm-up of other components.

The self-heating phenomenon occurs rather quickly, that is, within five minutes of application of power to, for example, a television receiver. On the other hand, the ambient temperature rise occurs relatively slowly over a period which may be ten times as long.

As the kine itself warms up, the control grid (G1) physically moves with respect to the cathodes, causing a change in the kine cutoff characteristics which also varies the black level.

Modern television receivers are employing multi-function integrated circuit chips (ICs) with heretofore unprecedented levels of complexity and circuit density. In order to reduce the power dissipation of these multi-function ICs it is common practice to limit the output signal swing peak-to-peak. The peak-to-peak signal at the input of the kine driver circuitry is thus at a lower level than was common in previous television receivers, and a higher gain kine driver amplifier is therefore required to produce the same level of brightness on the kine screen as produced by previous television receivers.

A recent trend among television manufacturers has been to provide kine face plates with a lower light transmissivity (52% rather than 85%) in an effort to improve picture contrast. This trend has caused the gain of the kine driver amplifier to be even further increased to provide a suitably bright picture. Typically the gain of the kine driver amplifier has been increased from the previous level of 40 to the present level of 60.

As a result of employing these high gain kine driver amplifiers a new problem has arisen, in that gain and/or offset variations of the video signal processing circuitry caused by temperature variations during warmup which previously may have been at an acceptable low level, are now aggravated to an objectionable level. This magnitude variation may manifest itself as an observable change in the black level on the kine screen.

It is known from U.S. Pat. No. 4,716,315 (Bell) to compensate for temperature variations in a video peaking circuit of a television receiver by adding a thermistor to compensate for the long-term ambient effects, and by adding a separate gain control circuit having a time constant approximating the relatively quick self-heating time to compensate for self-heating-caused parameter changes.

SUMMARY OF THE INVENTION

It is herein recognized that the use of a thermistor to compensate for long-term ambient heating effects and a separate time constant circuit for compensating for the effects of self-heating of the integrated circuit may be unnecessarily complex in that the use of a thermistor alone will adequately compensate for both long term ambient and self-heating temperature variations if the thermistor is properly located with respect to the amplifier to be controlled.

Specifically, it is herein recognized that the thermistor should be placed substantially adjacent to the control input terminal of the integrated circuit amplifier to be controlled, so that it may be responsive to the self-heating temperature variations of the integrated circuit. In one embodiment of the invention, the thermistor is a surface mountable device mounted on the printed circuit board beneath the integrated circuit to be controlled.

It is also herein recognized that a slight deliberate overcompensation of the signal at the cathodes of the kine can correct for black level drift due to kine warm up.

DETAILED DESCRIPTION OF THE DRAWING

Figure 1:
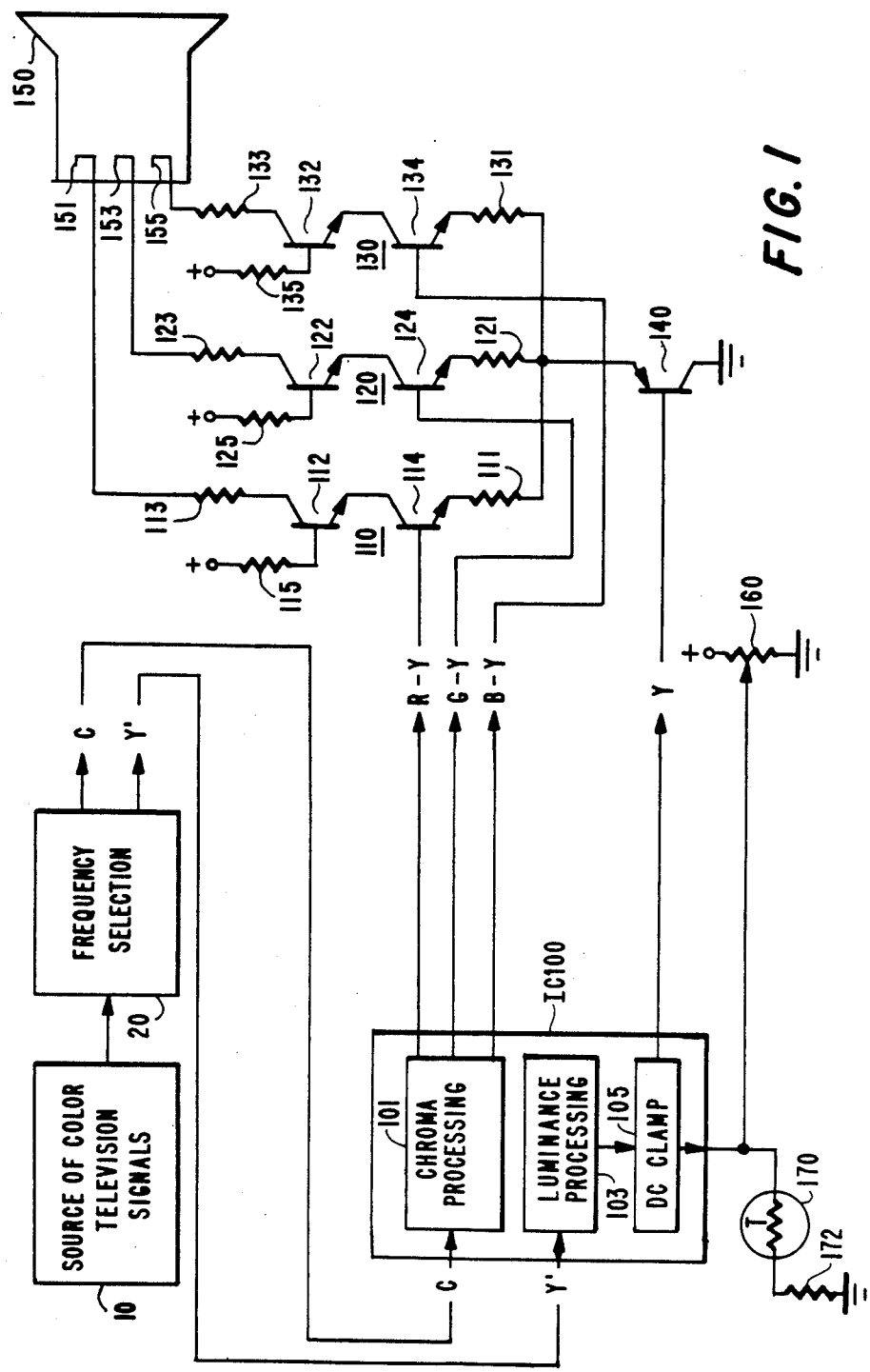
FIG. 1 illustrates, partly in block diagram form and partly in schematic diagram form, the circuitry of the invention.

The portions of a television receiver relevant to the invention are shown in FIG. 1. A source of color television signals 10 supplies signal to a frequency selection unit 20 which separates chrominance signals C and unprocessed luminance signals Y' and applies them to a multifunction high density integrated circuit IC100. IC100 may also contain sound processing and deflection circuitry (not shown) which are not relevant per se to this invention.

Chrominance signals C are applied to a chroma processing unit 101 which derives R-Y, G-Y, and B-Y signals therefrom. Unprocessed luminance signals Y' are applied to luminance processing unit 103, the output of which is clamped to the proper level by d.c. clamp 105, and applied to the base of luminance buffer amplifier 140. R-Y, G-Y, and B-Y signals are applied to the input of kine driver amplifiers 110, 120, and 130 respectively.

Each of these kine drive amplifiers is arranged in a cascode configuration as is well known. However, as was previously mentioned each of the kine driver amplifiers 110, 120, and 130 are high gain amplifiers (i.e. a gain of approximately 60). Kine driver amplifiers 110, 120 and 130 comprise cascode-connected transistors 112 and 114, 122 and 124 and 132 and 134 respectively. Luminance signals are applied to the emitters of transistors 114, 124, and 134 via coupling resistors 111, 121, and 131. Amplified video signals are applied to the individual cathodes 151, 153, 155 of kine 150 via load resistors 113, 123 and 133 respectively. Base bias for transistors 112, 122 and 132 is provided by resistors 115, 125 and 135 respectively.

D.C. clamp 105 may be a keyed clamp of the type known from U. S. Pat. No. 4,197,557 (Tuma et al.). Specifically, it has an input terminal to which the wiper of a brightness control 160 is coupled. Manual operation of the brightness control affects the d.c. level of the luminance signal and thus the brightness of the picture displayed on kine 150.

As noted above, the d.c. level of the luminance signal is subject to variation due to ambient and self heating type temperature changes. In order to compensate for this effect, thermistor 170 is mounted physically close to the control input terminal of integrated circuit IC100 and is electrically connected to the brightness input terminal in parallel with the wiper of the control potentiometer 160. Thermistor 170 has a negative temperature coefficient so that the control voltage supplied by the wiper of control potentiometer 160 is lowered when the temperature sensed by thermistor 170 rises. Resistor 172 is added for the case when correct compensation cannot be obtained by using a thermistor only. The effects of adding resistor 172 will be described with respect to FIGS. 4 and 5.

Figure 2:
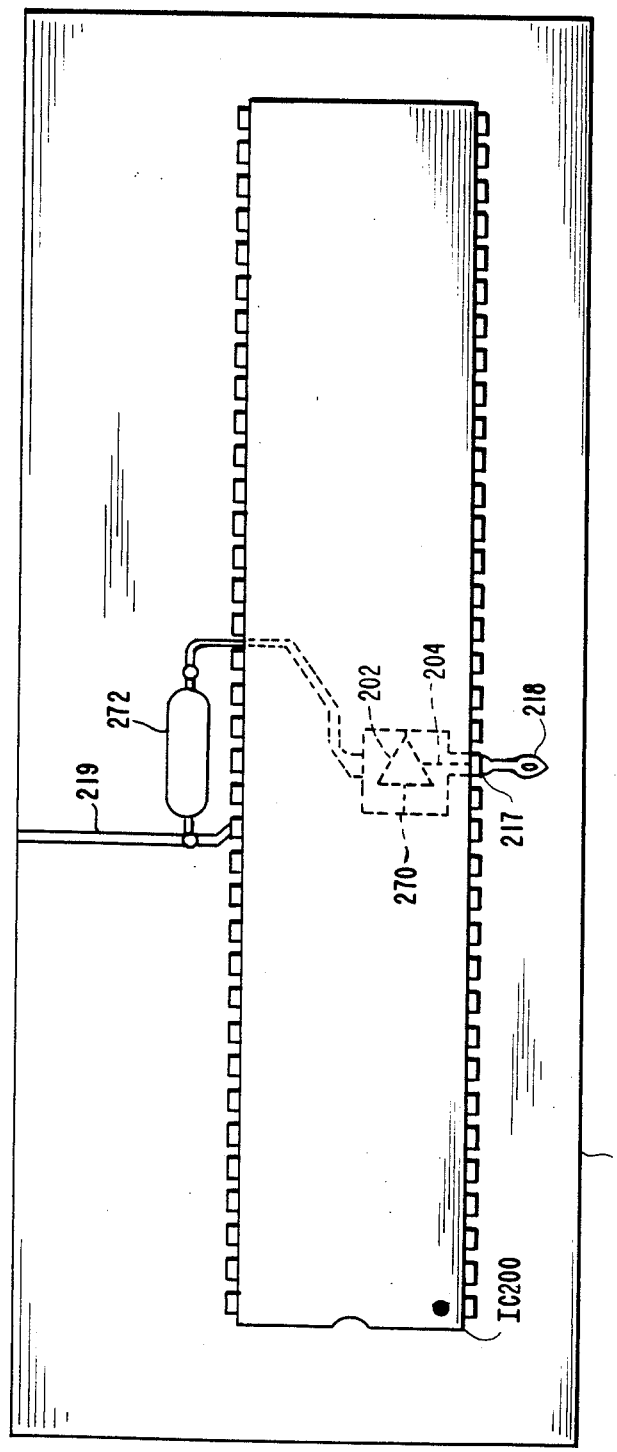
FIG. 2 illustrates an overhead view of an embodiment of the invention comprising the combination of a surface mountable thermistor and an integrated circuit chip mounted on a printed circuit board.

FIG. 2 shows, in an overhead view, a printed circuit board 201 having an integrated circuit IC 200 mounted thereon. Integrated circuit IC 200 corresponds to integrated circuit IC100 of FIG. 1. IC 200 contains an amplifier 202 including a magnitude control input terminal 204 (brightness) which may be, for example, terminal 217. Terminal 217 which corresponds to pin 17 of 64 pin IC 200, is connected to a printed circuit bonding pad 218 which is provided for receiving a signal input wire (not shown) leading to the wiper of the brightness control potentiometer 160 of FIG. 1.

A surface mountable thermistor 270 is mounted beneath IC200 and is physically located as closely as possible to the magnitude control input terminal 217. In this way thermistor 270 receives heat from IC200 and is responsive to temperature changes caused both by self-heating of integrated circuit IC200 and by changes in the ambient temperature heating of other components of the television receiver. The other end of thermistor 270 is coupled via resistor 272, which corresponds to resistor 172 of FIG. 1, to ground at a printed circuit board connection 219. The value of resistor 272 is chosen to provide the correct compensation for each particular circuit configuration. The effects of varying the value of resistor 272 are shown in FIG. 4 and will be discussed below.

Figure 3:
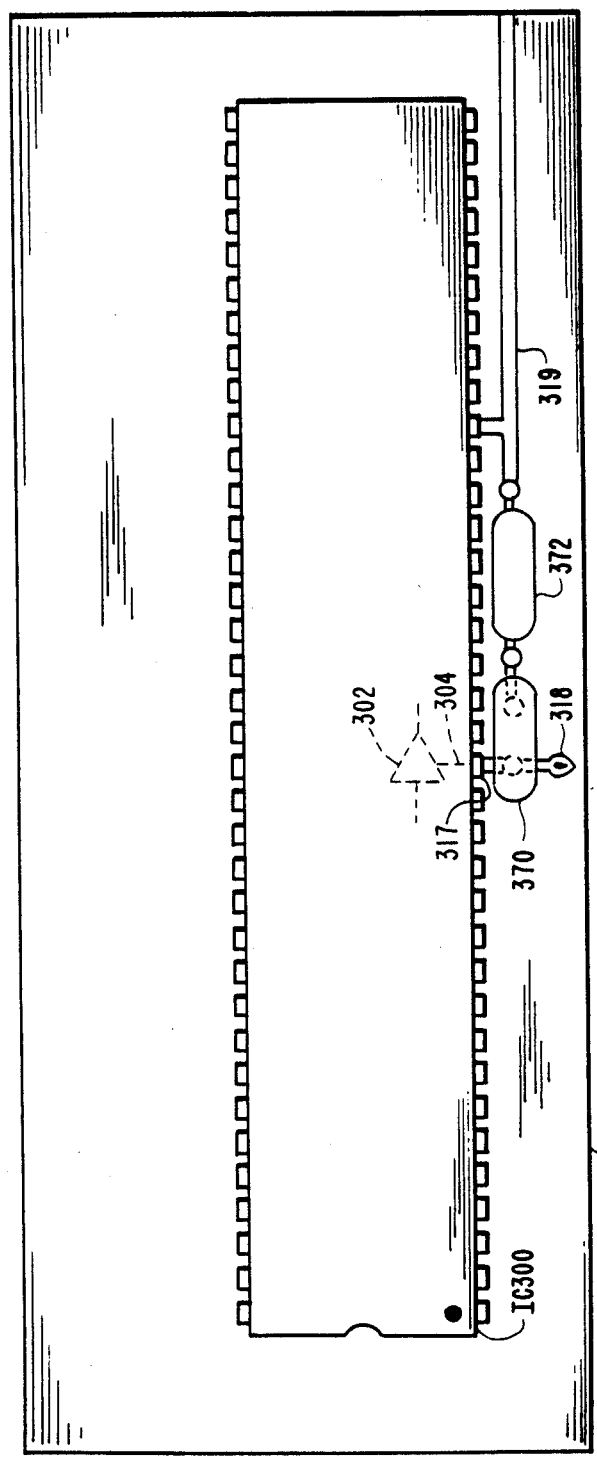
FIG. 3 illustrates an overhead view of an embodiment of the invention comprising the combination of a thermistor having wires for conventional mounting and an integrated chip mounted on a printed circuit board.

It is noted that it is also possible to mount a non-surface mountable type thermistor next to integrated circuit IC200 adjacent to the control input terminal rather than beneath IC200 without adversely affecting the operation of the invention. This is true because the thermistor still will be in close enough proximity to integrated circuit IC200 to be affected by temperature variations. This configuration is shown in FIG. 3 in which similarly numbered elements in FIGS. 2 and 3 serve the same function.

Figure 4:
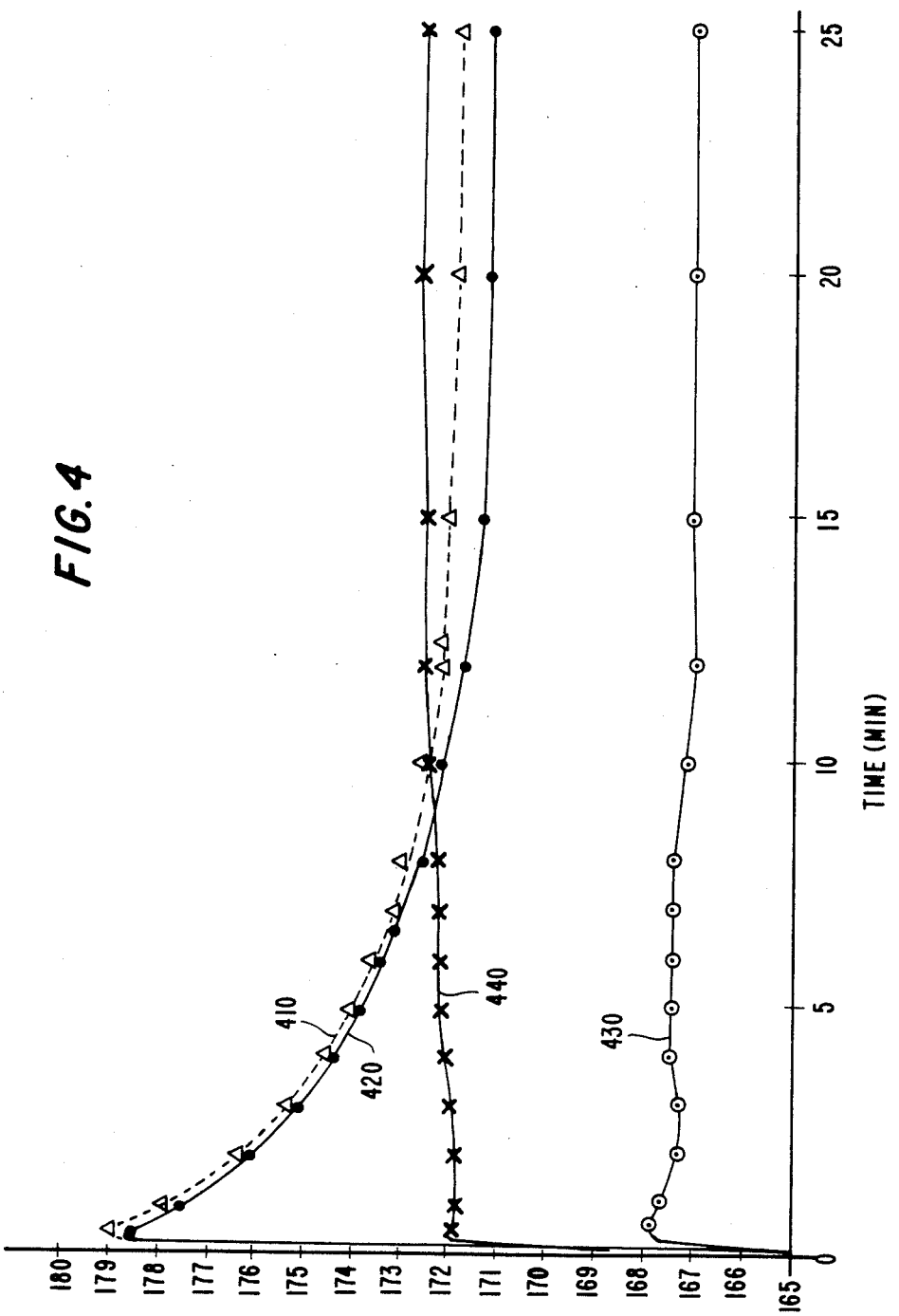
FIG. 4 is a graph illustrating the improvement in performance of a television receiver utilizing the circuitry of FIG. 1.

FIG. 4 illustrates the effects at the kine cathode of utilizing the compensation scheme of the invention. In analyzing curves 410-440 it should be noted that a decreasing level of cathode voltage causes an increasingly bright picture as displayed on the kine. Curves 410 and 420 indicate the response of a television receiver which has not been modified with the circuitry of FIG. 1. Curve 420 is a graph of the cathode voltage versus time which indicates the behavior of the voltage at the cathode when the television receiver has been allowed to cool down overnight. Curve 410 illustrates the behavior of the voltage at the kine cathode when the television receiver has been allowed to cool down for two hours.

Curves 430 and 440 illustrate the response of a television receiver which has been modified with the circuitry of FIG. 1. It should be noted that the actual levels of cathode voltage are arbitrary. A 100K ohm thermistor was used for thermistor 170 when both curves 430 and 440 were plotted. Curve 430 reflects the effect of using a 33K ohm series resistor for resistor 172. Note that the black level drift caused by temperature variation has been substantially eliminated. Curve 440 reflects the effect of using a 22K ohm series resistor for resistor 172. Note that the black level drift has been over compensated, as shown by the rise in cathode voltage. This effect is desirable, however, when one takes into account the tendency of the kine to drift towards a brighter picture, as noted below. Thus, the slightly overcompensated cathode voltage (which causes a darker picture) counteracts the drift of the kine which would otherwise cause an overly bright picture.

Figure 5:
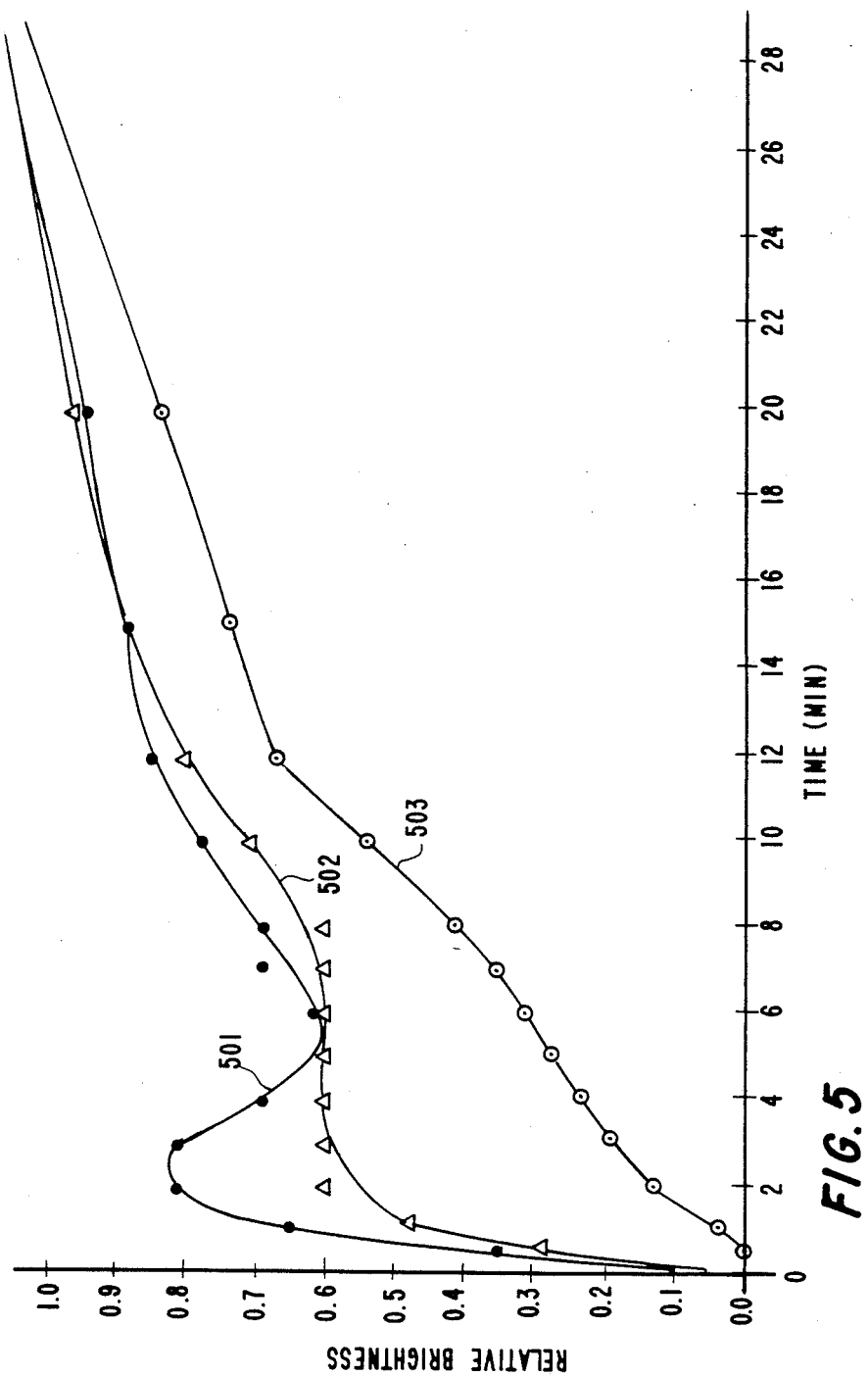
FIG. 5, is a graph of relative brightness versus time showing the effects of the circuitry of FIG. 1.

FIG. 5 is a graph of relative brightness versus time which illustrates the effect of thermal compensation with respect to brightness. Curve 503 illustrates the behavior of a television receiver which has not been modified with the circuitry of FIG. 1. Curve 501 illustrates the system response when the circuitry of FIG. 1 is used and the value of resistor 172 is 22K. Curve 502 illustrates the system response when the value of resistor 172 is 33K. Note that as the value of resistor 172 decreases, compensation increases.

By way of explanation, Curve 501 also closely approximates the behavior of the kine alone. That is, a kine which is connected to a power supply only, will undergo a brightness variation during warm-up which closely follows curve 501. Curve 503 shows a brightness characteristic which provides a picture that is too dark during the first five minutes of warm-up because the uncompensated television receiver circuitry is undesirably reducing the brightness level. Note that the goal is to allow the kine to operate as closely to its natural characteristic (curve 501) as possible. It is apparent from curve 502 that the compensation provided by the combination of the thermistor 170 and the 32K ohm series resistor 172 is not correct in that the brightness level during approximately the first three minutes of operation of the kine is too low. By slightly overcompensating the black level signal at the kine cathode, curve 501 was attained. As stated above, curve 501 closely approximates the natural behavior of the kine. Thus, the receiver circuitry has been rendered "transparent" to the kine, in that, it no longer significantly affects the brightness versus time graph of kine performance during warm up.

We claim:

1. Apparatus in a television receiver for compensating for the effects of temperature variations comprising:
a circuit board;
an integrated circuit including amplifier means, mounted on said circuit board, and having an input terminal for receiving signals to be amplified, an output terminal for developing amplified signals, and a magnitude control input terminal for receiving magnitude control signals for controlling the magnitude of said amplified signals;
means for generating said magnitude control signals and applying said magnitude control signals to said magnitude control input terminal; and
means, external to said integrated circuit and exhibiting an impedance which is dependent upon temperature, for sensing variations in said temperature and for modifying said impedance in accordance with a given temperature coefficient in response to said variations in temperature, said temperature-responsive impedance means being mounted on said circuit board proximate to said magnitude control input of said amplifier of said integrated circuit for receiving instantaneous self-induced temperature variations generated by said amplifier of said integrated circuit and for receiving ambient heat, said temperature-responsive impedance means being coupled to said magnitude control input terminal and to said means for generating magnitude control signals and being responsive to said instantaneous self-induced temperature variations of said amplifier of said integrated circuit and to ambient temperature for controlling the magnitude of said amplified signals.

2. The apparatus of claim 1 wherein said temperature-responsive impedance means is a thermistor.

3. The apparatus of claim 2 wherein said thermistor is a surface-mountable thermistor, and said surface-mountable thermistor is mounted on said circuit board beneath said integrated circuit.

4. The apparatus of claim 2 wherein said thermistor is mounted on said printed circuit board along side of said integrated circuit and in close proximity to said magnitude control input terminal.

5. In a television receiver having a picture tube including a cathode for receiving signals to be displayed, apparatus for compensating for brightness variations in a picture displayed on said picture tube of said television receiver during warm-up, comprising:
a circuit board;
an integrated circuit including amplifier means mounted on said circuit board, and having an input terminal for receiving signals to be amplified, an output terminal for developing amplified signals, and a brightness control terminal for receiving brightness control signals for controlling the DC level of said amplified signals;
means for generating said brightness control signals and applying said brightness control signals to said brightness control input terminal;
picture tube driver amplifier means having an input coupled to said output terminal of said integrated circuit for receiving said amplified signals to be further amplified, and an output coupled to said cathode of said picture tube for developing further amplified signals; and
means, external to said integrated circuit and exhibiting an impedance which is dependent upon temperature, for sensing variations in said temperature and for modifying said impedance in accordance with a given temperature coefficient in response to said variations in temperature, said temperature-responsive impedance means being mounted on said circuit board proximate to said brightness control input of said amplifier of said integrated circuit for receiving instantaneous self-induced temperature variations generated by said amplifier of said integrated circuit and for receiving ambient heat, said temperature-responsive impedance means being coupled to said brightness control input terminal and to said means for generating brightness control signals and being responsive to said instantaneous self-induced temperature variations of said amplifier of said integrated circuit and to ambient temperature for controlling the DC level of said amplified signals, and for controlling variations in brightness of said picture displayed on said picture tube.

6. The apparatus of claim 5 wherein said picture tube is a color picture tube and said cathode is one of a plurality of cathodes.

7. The apparatus of claim 6 wherein said temperature-responsive impedance means is a thermistor.

8. The apparatus of claim 7 wherein said thermistor is a surface-mountable thermistor mounted on said circuit board beneath said integrated circuit.

9. The apparatus of claim 7 wherein said thermistor is mounted on said circuit board alongside of said integrated circuit and in close proximity to said brightness control input terminal.

* * * * *